US008554349B2

(12) United States Patent
Hashimoto

(10) Patent No.: US 8,554,349 B2
(45) Date of Patent: Oct. 8, 2013

(54) HIGH-FREQUENCY INTERPOLATION DEVICE AND HIGH-FREQUENCY INTERPOLATION METHOD

(75) Inventor: Takeshi Hashimoto, Tokyo (JP)

(73) Assignee: Clarion Co., Ltd., Tokyo (JP)

( * ) Notice: Subject to any disclaimer, the term of this patent is extended or adjusted under 35 U.S.C. 154(b) by 775 days.

(21) Appl. No.: 12/680,899

(22) PCT Filed: Oct. 22, 2008

(86) PCT No.: PCT/JP2008/069089
§ 371 (c)(1), (2), (4) Date: Mar. 30, 2010

(87) PCT Pub. No.: WO2009/054393
PCT Pub. Date: Apr. 30, 2009

(65) Prior Publication Data
US 2010/0222907 A1 Sep. 2, 2010

(30) Foreign Application Priority Data
Oct. 23, 2007 (JP) ................................ 2007-274606

(51) Int. Cl.
*G06F 17/00* (2006.01)
*H03G 5/00* (2006.01)

(52) U.S. Cl.
USPC ................................ 700/94; 381/98; 381/101

(58) Field of Classification Search
CPC ................ G10L 21/308; G10L 21/013; G11B 20/00007; G11B 2020/00007; G11B 2020/00014; G11B 2020/10546; G11B 2020/10555; G11B 2020/10564; G10H 2250/621; G10H 2210/136; G10H 1/12; G10H 1/0091; G10H 1/16; G10K 2210/3051; H04N 7/465
USPC ................. 381/56, 61, 94.2, 98, 101; 700/94; 708/290
See application file for complete search history.

(56) References Cited

U.S. PATENT DOCUMENTS 6,708,145 B1 * 3/2004 Liljeryd et al. ............ 704/200.1
6,865,430 B1 * 3/2005 Runton et al. .................. 700/94
(Continued)

FOREIGN PATENT DOCUMENTS

JP 9-23127 1/1997
JP 2006-243043 9/2006
(Continued)

OTHER PUBLICATIONS

Japanese Office Action for corresponding JP Application No. 2009-538225, Oct. 23, 2012.

(Continued)

*Primary Examiner* — Jesse Elbin
(74) *Attorney, Agent, or Firm* — Ditthavong Mori & Steiner, P.C.

(57) ABSTRACT

It is possible to generate an interpolation signal in which spectrum in frequency characteristics develops in a continuous manner according to a reproduced music without increasing the sampling rate (sampling frequency) in up-sampling processing. A high-frequency interpolation device 1 includes: a frequency band determination section 2 that determines a bandwidth type of an audio signal as a frequency band determination value preset for each bandwidth according to the frequency characteristics of the audio signal; and an interpolation signal generation section 3 that selects a filter coefficient of a high-pass filter in accordance with the frequency band determination value 2, performs filtering for the audio signal by using the high-pass filter having the selected filter coefficient, and generates a high-frequency interpolation signal for the audio signal.

4 Claims, 17 Drawing Sheets

(56) References Cited

U.S. PATENT DOCUMENTS

| | | | | |
|---|---|---|---|---|
| 2003/0044024 | A1 * | 3/2003 | Aarts et al. | 381/61 |
| 2006/0192706 | A1 * | 8/2006 | Fujiyama et al. | 341/155 |
| 2009/0171666 | A1 * | 7/2009 | Ohtsu | 704/265 |

FOREIGN PATENT DOCUMENTS

| | | |
|---|---|---|
| JP | 2007-192964 | 8/2007 |
| JP | 2009-086018 | 4/2009 |
| WO | WO 03/044777 | 5/2003 |
| WO | WO 2007029796 | 3/2007 |

OTHER PUBLICATIONS

Supplementary European Search Report for corresponding EP Application No. 08841188, Nov. 4, 2011.

Japanese Office Action for corresponding JP Application No. 2009-538225, Jul. 9, 2013.

* cited by examiner

TABLE 1: FREQUENCY BAND DIVISION

| FREQUENCY BAND | FREQUENCY RANGE | FFT SAMPLE POINT RANGE |
|---|---|---|
| 1 | Lower than 9.5 kHz | Lower than 51 |
| 2 | Higher than 9.5 kHz or lower than10.5 kHz | Higher than 51 or lower than 56 |
| 3 | Higher than 10.5kHz or lower than 11.5 kHz | Higher than 56 or lower than 61 |
| 4 | Higher than 11.5 kHz or lower than 12.5 kHz | Higher than 61 or lower than 67 |
| 5 | Higher than 12.5 kHz or lower than 13.5 kHz | Higher than 67 or lower than 72 |
| 6 | Higher than 13.5 kHz or lower than 14.5 kHz | Higher than 72 or lower than 77 |
| 7 | Higher than 14.5 kHz or lower than 15.5 kHz | Higher than 77 or lower than 83 |
| 8 | Higher than 15.5 kHz or lower than 16.5 kHz | Higher than 83 or lower than 88 |
| 9 | Higher than 16.5 kHz | Higher than 88 |

*FIG. 4*

TABLE 2: RELATIONSHIP BETWEEN HPF FREQUENCY BAND AND CUT-OFF FREQUENCY

| HPF FREQUENCY BAND | CUT-OFF FREQUENCY |
|---|---|
| 1 | 4 kHz |
| 2 | 5 kHz |
| 3 | 6 kHz |
| 4 | 7 kHz |
| 5 | 8 kHz |
| 6 | 9 kHz |
| 7 | 10 kHz |
| 8 | 11 kHz |
| 9 | 12 kHz |
| 10 | 13 kHz |
| 11 | 14 kHz |
| 12 | 15 kHz |
| 13 | 16 kHz |

*FIG. 8*

TABLE 3: SINE WAVE FREQUENCY CORRESPODING TO FREQUENCY BAND DETERMINATION VALUE AND ITS PHASE

| FREQUENCY BAND | SINE WAVE FREQUENCY | PHASE | |
|---|---|---|---|
| | | A | B |
| 1 | No generation | — | — |
| 2 | −6 kHz | 90 degrees | 0 degrees |
| 3 | −4 kHz | 90 degrees | 0 degrees |
| 4 | −2 kHz | 90 degrees | 0 degrees |
| 5 | 0 Hz | 0 degrees | 90 degrees |
| 6 | 2 kHz | 0 degrees | 90 degrees |
| 7 | 4 kHz | 0 degrees | 90 degrees |
| 8 | 6 kHz | 0 degrees | 90 degrees |
| 9 | No generation | — | — |

*FIG. 14*

HIGH-FREQUENCY INTERPOLATION DEVICE AND HIGH-FREQUENCY INTERPOLATION METHOD

TECHNICAL FIELD

The present invention relates to a high-frequency interpolation device and a high-frequency interpolation method and, more particularly, to a high-frequency interpolation device and a high-frequency interpolation method capable of generating a suitable high-frequency interpolation signal in accordance with the frequency band of an audio signal.

BACKGROUND ART

Today, a digital audio equipment that outputs music information recorded in a recording medium such as a CD or a DVD using a reproduction device such as a CD player or a DVD player is in widespread use. Since music information is recorded as digital information in a recording medium such as a CD in such a digital audio equipment, deterioration of the music quality accompanied by repeated reproduction/recording operation can be prevented, allowing a user to always enjoy high quality music. However, general digital information (music information) recorded in such a recording medium is limited to information within a frequency range that can be generally perceived by the human ear, and high-frequency music information higher than a predetermined frequency is deleted.

For example, it is said that the frequency that can be generally perceived by the human ear is from 20 Hz to 20 kHz. The sampling frequency used in a music CD is 44.1 kHz, and the frequency range that can be reproduced by this CD is 20 kHz or less. As described above, in a recording medium such as a CD, music information having a frequency higher than a frequency (20 kHz) that can be perceived by the human ear is deleted.

However, the human ear can perceive a high-frequency component higher than 20 kHz as a difference in tone. Therefore, many users say that sound output from the digital audio equipment in which the high-frequency component has been cut off has less richness or punch as compared to sound output from a conventional analog/audio equipment. Thus, today, there is proposed a method that interpolates a high-frequency audio signal in the music to be reproduced in the digital audio equipment so as to enhance a feeling of satisfaction of listeners (refer to, e.g., Patent Document 1).

A high-frequency interpolation device disclosed in Patent Document 1 performs up-sampling for a predetermined upper limit frequency in a high-frequency limited audio signal, i.e., applies zero-order interpolation to the center of the signal and then performs low-pass filtering processing so as to remove a high-frequency signal for down-sampling. Further, the high-frequency interpolation device performs envelope processing so as to allow the audio signal to have prescribed characteristics, thereby achieving high-frequency interpolation.

An application of such high-frequency interpolation enables removal of feeling of lack of high-frequency range at the time of sound reproduction.

Patent Document 1: JP-A-9-23127 (pages 2 and 3, FIG. 2)

DISCLOSURE OF THE INVENTION

Problems to be Solved by the Invention

However, the up-sampling is performed for a predetermined upper limit frequency of the audio signal in the above high-frequency interpolation device, so that the sampling frequency (sampling rate) doubles or more. For example, in the case of a music CD in which the sampling frequency is set to 44.1 kHz, the up-sampling frequency doubles to 88.2 kHz. In the case of a music DVD in which the sampling frequency is set to 96 kHz, the up-sampling frequency doubles to 192 kHz. When the up-sampling processing is performed for the high-frequency range as described above, a processing load on the high-frequency interpolation device is increased, thereby making it difficult to smoothly carry out the high-frequency interpolation processing and increasing the cost of the high-frequency interpolation device.

Further, effective bandwidth or frequency level of the audio signal whose frequency band has been limited varies every second depending on the type of an audio source or reproduction position of opening, ending, or hook-line of the audio source. However, such a variation is not taken into consideration in the high-frequency interpolation device. Therefore, when the abovementioned high-frequency interpolation device is used to actually perform high-frequency interpolation, the spectrum may become discontinuous in frequency characteristics, with the result that interpolation effect is reduced.

The present invention has been made in view of the above problem, and an object thereof is to provide a high-frequency interpolation device capable of generating an interpolation signal in which spectrum in frequency characteristics develops in a continuous manner according to a reproduced music without increasing the sampling rate (sampling frequency) in up-sampling processing.

Means for Solving the Problems

To solve the above problem, according to an aspect of the present invention, there is provided a high-frequency interpolation device including: a frequency band determination section that determines a bandwidth type of an audio signal as a frequency band determination value preset for each bandwidth according to the frequency characteristics of the audio signal; and an interpolation signal generation section that selects a filter coefficient of a high-pass filter in accordance with the frequency band determination value, performs filtering for the audio signal by using the high-pass filter having the selected filter coefficient, and generates a high-frequency interpolation signal for the audio signal.

Further, according to another aspect of the present invention, there is provided a high-frequency interpolation method including: a frequency band determination step in which a frequency band determination section determines a bandwidth type of an audio signal as a frequency band determination value preset for each bandwidth according to the frequency characteristics of the audio signal; and an interpolation signal generation step in which an interpolation signal generation section selects a filter coefficient of a high-pass filter in accordance with the frequency band determination value, performs filtering for the audio signal by using the high-pass filter having the selected filter coefficient, and generates a high-frequency interpolation signal for the audio signal.

According to the high-frequency interpolation device and high-frequency interpolation method of the present invention, the filter coefficient of a high-pass filter is selected based on the frequency band determination value, and then the filtering of the audio signal is performed using a high-pass filter having the selected filter coefficient, followed by generation of a high-frequency interpolation signal for the audio signal, whereby a high-frequency interpolation signal to be generated can be adjusted in accordance with the bandwidth of the audio signal, and an optimum high-frequency interpolation signal can be generated in accordance with the bandwidth of the audio signal. Thus, it is possible to generate an interpolation signal in which spectrum in frequency characteristics of the audio signal develops in a continuous manner. Further, richness or punch of the sound can be added to the audio signal to be reproduced without strangeness to thereby enhance a feeling of satisfaction of listeners.

The high-frequency interpolation device of the present invention may comprise a frequency conversion section that performs frequency conversion of the interpolation signal generated by the interpolation signal generation section in accordance with the frequency band determination value determined by the frequency band determination section.

The high-frequency interpolation method of the present invention may include a frequency conversion step in which a frequency conversion section performs frequency conversion of the interpolation signal generated in the interpolation signal generation step in accordance with the frequency band determination value determined in the frequency band determination step.

As described above, according to the high-frequency interpolation device and high-frequency interpolation method of the present invention, the frequency conversion of the interpolation signal is performed in accordance with the frequency band determination value, which allows the interpolation signal to be adjusted in accordance with the frequency level of the audio signal. Thus, it is possible to generate an interpolation signal in which spectrum in frequency characteristics of the audio signal develops in a frequency level in a continuous manner and to add richness or punch of the sound to the audio signal to be reproduced without strangeness to thereby enhance a feeling of satisfaction of listeners.

Further, in the high-frequency interpolation device, the interpolation signal generation section may include: a down-sampling section that performs down-sampling processing for the signal that has been subjected to the filtering of the audio signal by the high-pass filter; an up-sampling section that performs up-sampling processing for the audio signal that has been subjected to the down-sampling processing; and a subtraction processing section that subtracts the signal that has been subjected to the filtering of the audio signal by the high-pass filter from the signal that has been subjected to the up-sampling processing.

Further, in the high-frequency interpolation method, the interpolation signal generation step may comprise: a down-sampling step in which a down-sampling section performs down-sampling processing for the signal that has been subjected to the filtering of the audio signal by the high-pass filter; an up-sampling step in which an up-sampling section performs up-sampling processing for the signal that has been subjected to the down-sampling processing; and a subtraction processing step in which a subtraction processing section subtracts the signal that has been subjected to the filtering of the audio signal by the high-pass filter from the signal that has been subjected to the up-sampling processing.

According to the high-frequency interpolation device and high-frequency interpolation method of the present invention, the sampling rate (frequency) of the signal that is subjected to the down-sampling and up-sampling processing is not increased to the integral multiple of the sampling rate (frequency) of the original audio signal, thereby suppressing a processing load.

Advantages of the Invention

According to the high-frequency interpolation device and high-frequency interpolation method of the present invention, the frequency band and frequency level of the interpolation signal can be corrected/adjusted in accordance with the bandwidth of the audio signal, allowing generation of an interpolation signal in which spectrum in frequency characteristics of the audio signal develops in a continuous manner. Thus, it is possible to add richness or punch of the sound to the high-frequency band interpolated audio signal to be reproduced without strangeness to thereby enhance a feeling of satisfaction of listeners.

Further, the down-sampling processing and up-sampling processing are applied to a signal having the same sampling rate (frequency) as the sampling rate (frequency) of the audio signal so as to generate an interpolation signal, thereby suppressing a processing load in the generation of the interpolation signal.

BRIEF DESCRIPTION OF THE DRAWINGS

FIG. 4 is a table showing bandwidths obtained by frequency band division that a frequency band determination section according to the present embodiment uses to determine a frequency band determination value.

FIG. 8 is a table showing correspondence of filter coefficients one of which is selected based on an HPF frequency band determination value in a filter coefficient table section according to the present embodiment.

FIG. 14 is a table showing a relationship between a sine wave frequency that a sine wave generation section according to the present embodiment generates in accordance with the frequency band determination value and its phase.

Figure 1:
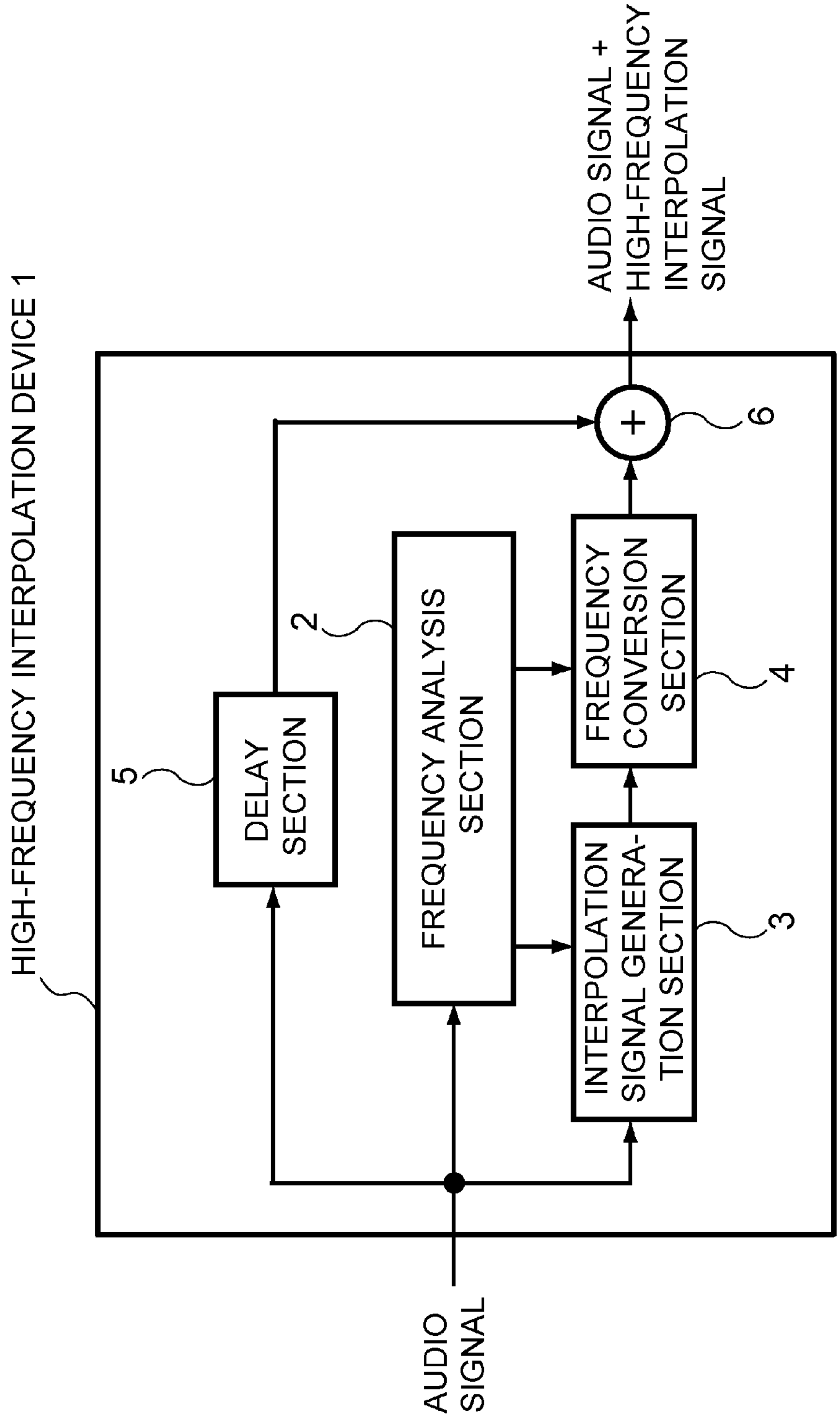
FIG. 1 is a block diagram showing a schematic configuration of a high-frequency interpolation device according to an embodiment of the present invention.

| Description of Reference Numerals | |
|---|---|
| 1 | high-frequency interpolation device |
| 2 | frequency analysis section |
| 3 | interpolation signal generation section (interpolation signal generation section) |
| 4 | frequency conversion section (frequency conversion section) |
| 5 | delay section |
| 6 | addition section |
| 8 | FFT section |
| 9 | threshold detection section |
| 10 | majority determination section |
| 11 | frequency band determination section (frequency band determination section) |
| 12 | cut-off frequency calculation section |
| 15 | filter coefficient table section |
| 16 | HPF section |
| 17 | sampling conversion section |
| 20 | down-sampling section (down-sampling section) |
| 21 | gain correction section |
| 22 | up-sampling section (up-sampling section) |
| 23 | subtraction processing section (subtraction processing section) |
| 25 | Hilbert transformation section |
| 26 | delay section |
| 27 | sine wave generation section |
| 28, 29 | multiplication processing section |
| 30 | subtraction processing section |

BEST MODE FOR CARRYING OUT THE INVENTION

A high-frequency interpolation device according to the present invention will be described in detail below with reference to the accompanying drawings.

FIG. 1 is a block diagram showing a schematic configuration of a high-frequency interpolation device according to the present invention. As shown in FIG. 1, a high-frequency interpolation device 1 includes a frequency analysis section 2, an interpolation signal generation section (interpolation signal generation section) 3, a frequency conversion section (frequency conversion section) 4, a delay section 5, and an addition section 6.

The functions of the frequency analysis section 2 (including a frequency band determination section and a cut-off frequency section to be described later), interpolation signal generation section 3 (including a sampling conversion section to be described later), frequency conversion section 4 and the like that constitute the high-frequency interpolation device 1 may be achieved by a microprocessor suitable for general digital signal processing. More specifically, the high-frequency interpolation device 1 may be implemented as a general digital signal processor. Alternatively, a versatile central processing unit may execute the functions of the frequency analysis section 2, interpolation signal generation section 3, frequency conversion section 4 and the liked according to a program (i.e., central processing unit may realize the functional blocks).

The high-frequency interpolation device 1 adds a high-frequency interpolation signal to an audio signal stored in a CD or a DVD in which high-frequency acoustic data has been cut off so as to enhance the richness or punch of the sound.

More specifically, the frequency analysis section 2 analyzes the frequency of an input audio signal, the interpolation signal generation section 3 generates a high-frequency interpolation signal in accordance with the analyzed frequency, and the frequency conversion section 4 performs frequency conversion for the generated interpolation signal in consideration of the frequency band of the audio signal. After that, the resultant interpolation signal is combined with the audio signal to thereby generate an audio signal in which the high-frequency interpolation has been made.

Figure 2:
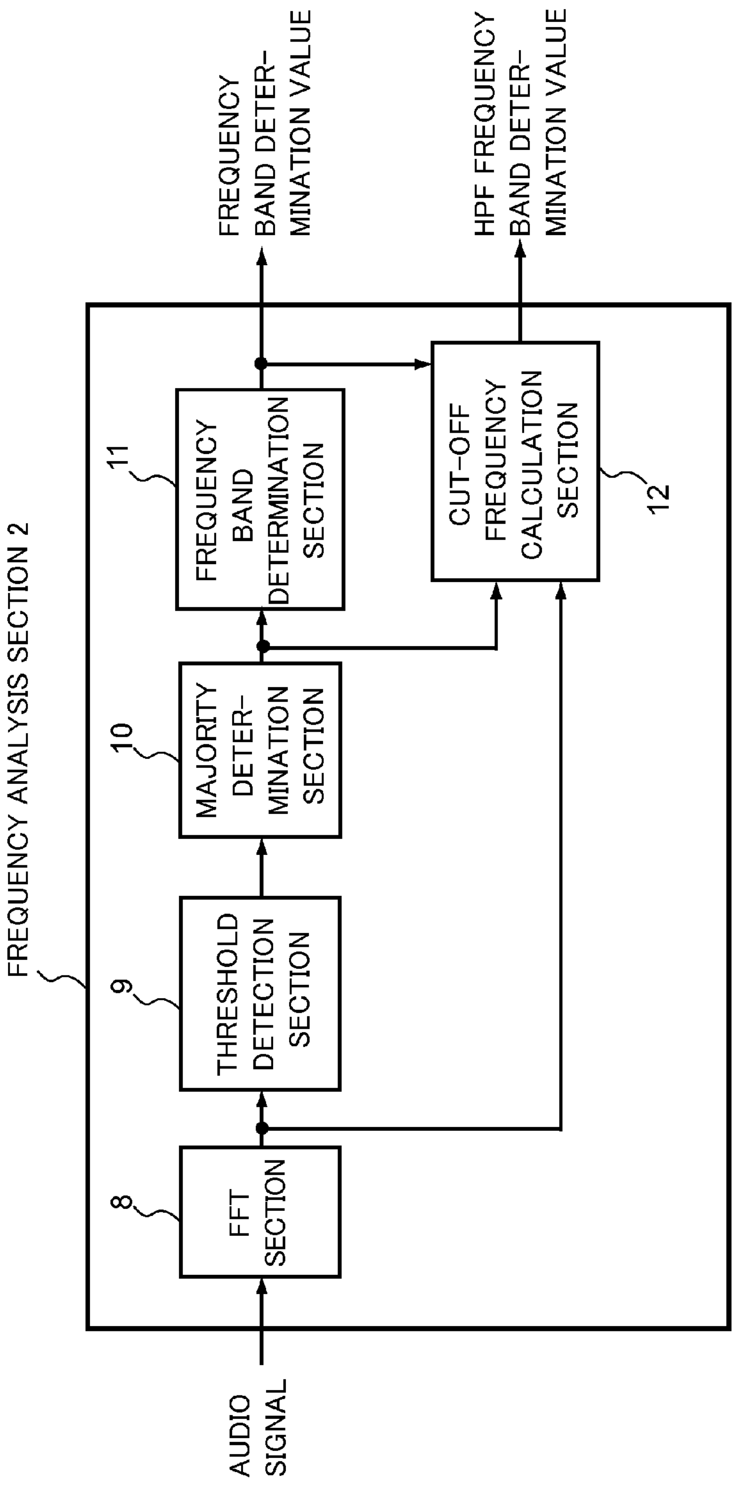
FIG. 2 is a block diagram showing a schematic configuration of a frequency analysis section according to the present embodiment.

FIG. 2 is a block diagram showing a schematic configuration of the frequency analysis section 2. The frequency analysis section 2 analyzes an audio signal to determine the frequency band to which the audio signal belongs based on a frequency band determination value and applies offset processing to the frequency band determination value to calculate an HPF frequency band determination value.

As shown in FIG. 2, the frequency analysis section 2 includes an FFT section 8, a threshold detection section 9, a majority determination section 10, a frequency band determination section (frequency band determination section) 11, and a cut-off frequency calculation section 12.

The FFT section 8 performs high-speed Fourier transformation (i.e., FFT calculation) for the audio signal at predetermined intervals. Through the high-speed Fourier transformation, the audio signal is transformed into a frequency domain. The FFT section 8 performs the high-speed Fourier transformation to transform the audio signal into a frequency domain and, at the same time, performs averaging processing and decibel conversion. After performing the above processing, the FFT section 8 performs maximum value hold processing for each FFT sample.

The threshold detection section 9 calculates the signal level of a low-medium-frequency band component and signal level of a high-frequency band component based on the frequency characteristics of the audio signal calculated by the FFT section 8. Then, based on the calculated signal levels of the low-medium-frequency band and high-frequency band components, the threshold detection section 9 sets the intermediate value between the signal levels as a threshold and detects the bandwidth of the audio signal based on the threshold.

In the case where a difference between the signal levels of the low-medium-frequency band and high-frequency band components is small and where the signal level of the high-frequency band component is higher than a predetermined level, it is determined that the threshold detection section 9 cannot detect the threshold, and the high-frequency interpolation processing in the high-frequency interpolation device is not performed.

Figure 3A:
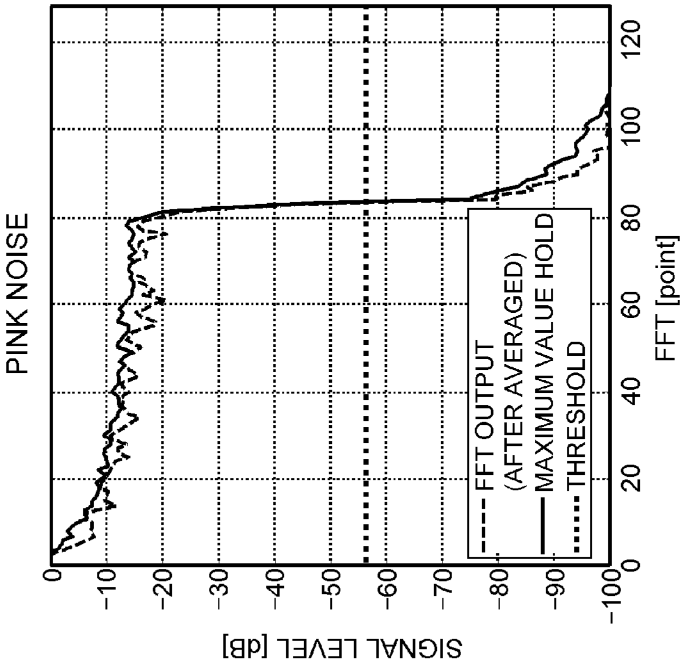
FIGS. 3(*a*) and 3(*b*) are graphs showing examples of operation of an FFT section and a threshold detection section according to the present embodiment, wherein FIG. 3(*a*) shows an example of operation in the case where pink noise is set as an audio signal, and FIG. 3(*b*) shows an example of operation in the case where music is set as an audio signal.
Figure 3B:
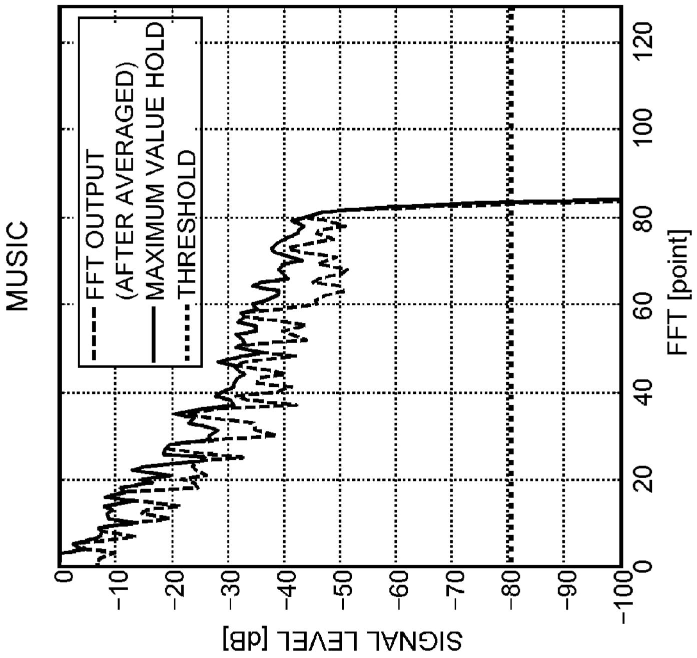

FIGS. 3(*a*) and 3(*b*) are graphs showing examples of operation of the FFT section 8 and threshold detection section 9. FIG. 3(*a*) shows an example of operation in the case where pink noise having a sampling rate (frequency) of 48 kHz and a bandwidth of 15 kHz is set as an audio signal. FIG. 3(*b*) shows an example of operation in the case where music having the same sampling rate and same bandwidth as those of the pink noise shown in FIG. 3(*a*) is set as an audio signal.

For example, in the high-speed Fourier transformation processing in the FFT section 8, the FFT length is set to 256 samples, the number of averaged frames is set to 4 frames, and the number of frames holding maximum value is set to 16 frames. Here, one frame corresponds to 128-sample length which is half the FFT length.

In the threshold detection section 9, the signal level of the low-medium-frequency band component is set to 10 kHz or less, and signal level of the high-frequency band component is set to 20 kHz or more. In terms of the FFT sample point of the output from the FFT section 8, the signal level of the low-medium-frequency band component corresponds to a level of 53 points or less, and signal level of the high-frequency band component corresponds to a level of 107 points or more. In the setting described above, the threshold in the pink noise is set to −56 dB (refer to FIG. 3(*a*)), threshold in the music is set to −81 dB (refer to FIG. 3(*b*)), and the bandwidth in the FFT sample point is detected as 82 points in the cases of both the pink noise and music.

The majority determination section 10 determines, at one frame interval (i.e., as described above, at intervals of 128 samples in the present embodiment), an optimum detection value by majority decision from among the detection values of the bandwidths output from the threshold detection section 9. In the case where the number of detection values to be determined is set to, e.g., "4" and where four values of "82", "79", "82", and "81" are detected as the detection value of the bandwidth, "82", which is a most frequently detected value, is determined as the optimum detection value. Although the number of detection values to be determined is set to 4 in the present embodiment as an example, it is not limited to 4 but may be smaller or larger than 4.

Note that the averaging processing and maximum value hold processing are performed in a combined manner by the FFT section 8, thereby improving the detection accuracy of the bandwidth in the majority determination section 10.

The frequency band determination section 11 determines which frequency band the bandwidth determined by the majority determination section 10 belongs to as a frequency band determination value. In the present embodiment, as shown in Table 1 of FIG. 4, the frequency band is divided into 9 ranges with intervals of 1.0 kHz for the frequency band determination. The FFT sample point is 82 points in the cases of both the pink noise and music shown in FIGS. 3(*a*) and 3(*b*), so that the frequency band determination value is obtained as "7" based on Table 1.

The cut-off frequency calculation section 12 calculates the inclination of the frequency of the audio signal whose maximum value is held in the FFT section 8 using first-order regression analysis.

Subsequently, the cut-off frequency calculation section 12 performs offset processing for the frequency band determination value determined by the frequency band determination section 11 based on the inclination of the frequency calculated using the first-order regression analysis to calculate an HPF frequency band determination value.

Figure 5:
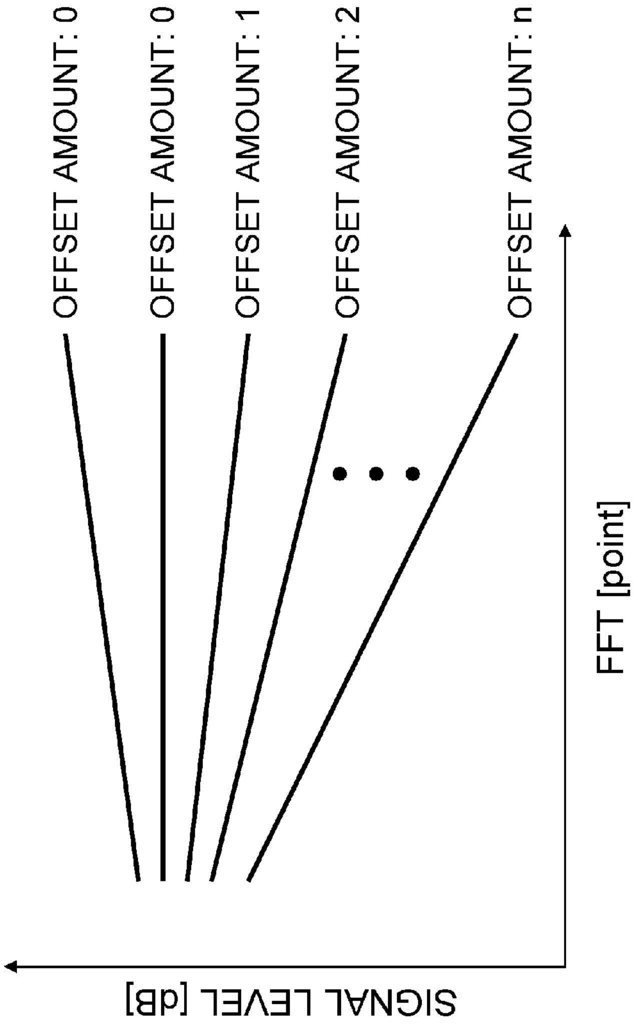
FIG. 5 is a graph showing an offset amount changing with the inclination of the frequency.

FIG. 5 is a graph showing an offset amount changing with the inclination of the frequency. As shown in FIG. 5, in the case where there is no inclination in the frequency (in the case where the frequency is flat), or where the value of the high-frequency band component is higher than that of the low-frequency band component, the offset amount is 0. In the case where the value of the high-frequency band component is lower than that of the low-frequency band component, the offset amount increases as the inclination of the frequency becomes larger in the negative direction. As the upper limit of the frequency band to be analyzed in the regression analysis, the detection value of the frequency band obtained by the majority determination section 10 is set.

Figure 6A:
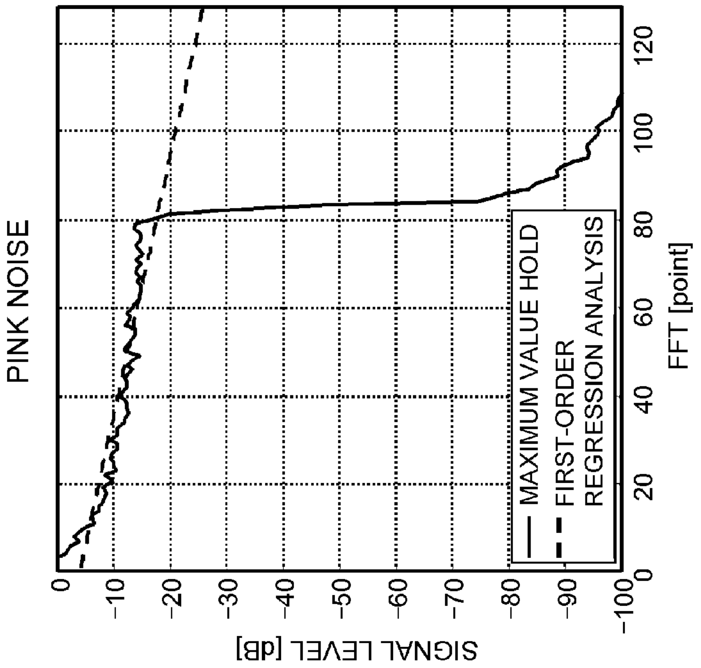
FIG. 6(*a*) shows frequency characteristics of the pink noise of FIG. 3(*a*) whose maximum value is held and an example of first-order regression analysis curve calculated from the inclination of the frequency and FIG. 6(*b*) shows frequency characteristics of the music of FIG. 3(*b*) whose maximum value is held and an example of first-order regression analysis curve calculated from the inclination of the frequency.
Figure 6B:
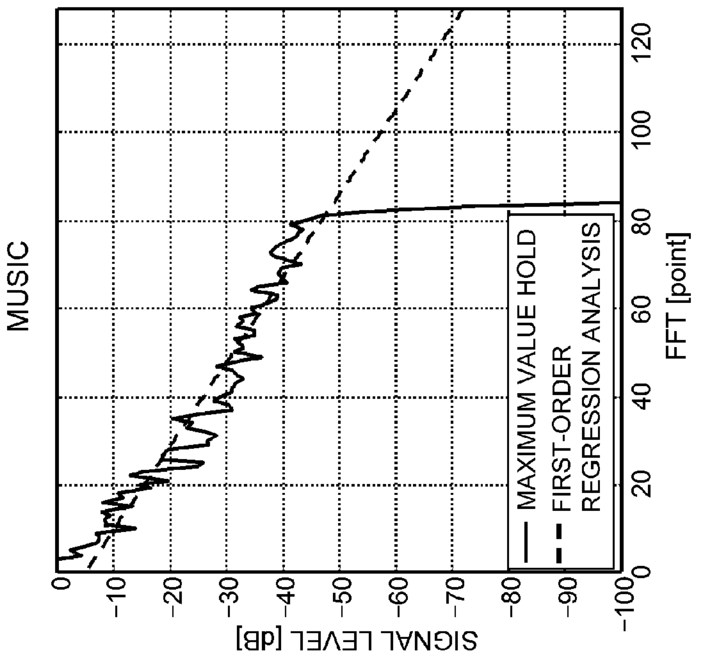

FIG. 6(*a*) shows frequency characteristics of the pink noise of FIG. 3(*a*) whose maximum value is held and an example of first-order regression analysis curve calculated from the inclination of the frequency. FIG. 6(*b*) shows frequency characteristics of the music of FIG. 3(*b*) whose maximum value is held and an example of first-order regression analysis curve calculated from the inclination of the frequency. The frequency characteristics of the pink noise shown in FIG. 6(*a*) are comparatively flat, so that the offset amount is 0. On the other hand, the value of the high-frequency band component is lower than that of the low-frequency band component in the frequency characteristics of the music shown in FIG. 6(*b*), so that 1 is obtained as the offset amount in accordance with the inclination of FIG. 5.

Figure 7:
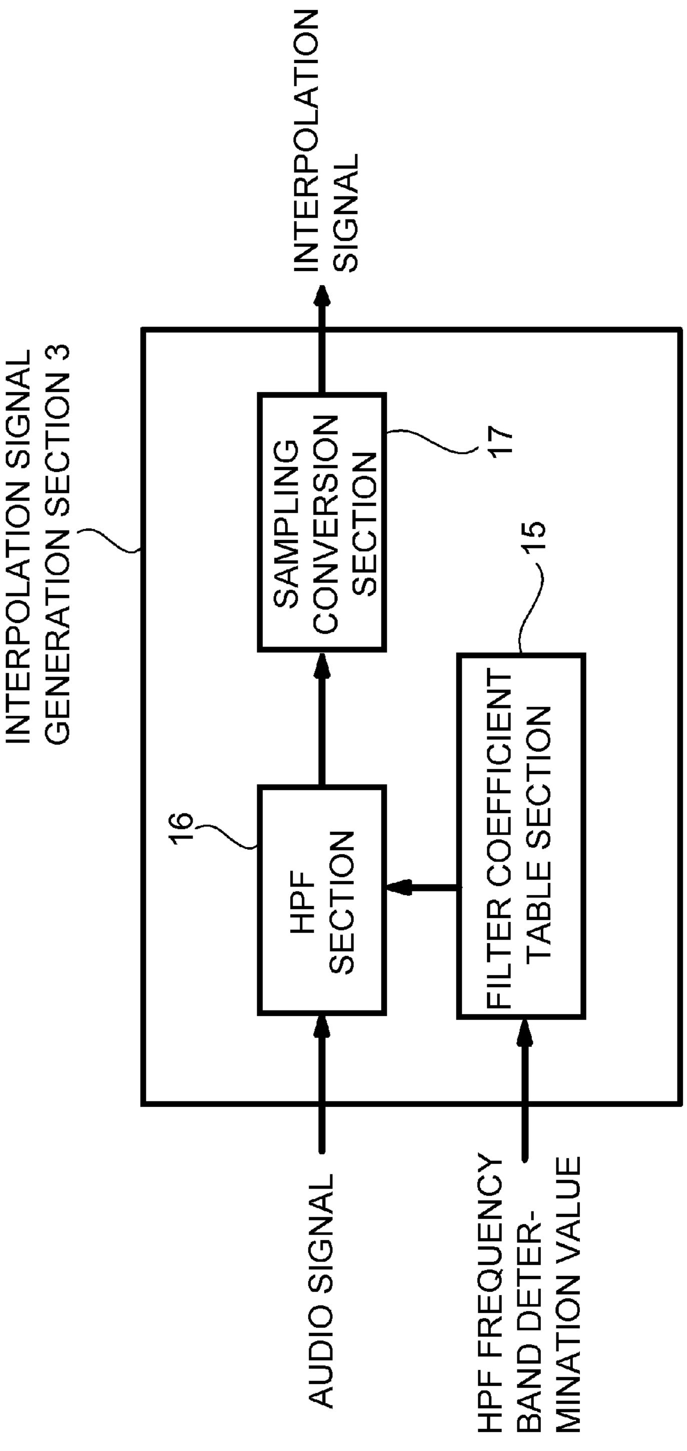
FIG. 7 is a block diagram showing a schematic configuration of an interpolation signal generation section according to the present embodiment.

Next, the interpolation signal generation section 3 will be described. The interpolation signal generation section 3 generates an optimum interpolation signal based on the input audio signal. As shown in FIG. 7, the interpolation signal generation section 3 includes a filter coefficient table section 15, an HPF section 16, and a sampling conversion section 17.

The filter coefficient table section 15 selects a filter coefficient applied in the HPF section 16 based on the HPF frequency band determination value calculated by the cut-off frequency calculation section 12. More specifically, as shown in Table 2 of FIG. 8, the filter coefficient table section 15 selects, in accordance with the HPF frequency band determination value, a filter coefficient from among a plurality of filter coefficients by which cut-off frequencies of 4 kHz to 16 kHz are determined.

Figure 9:
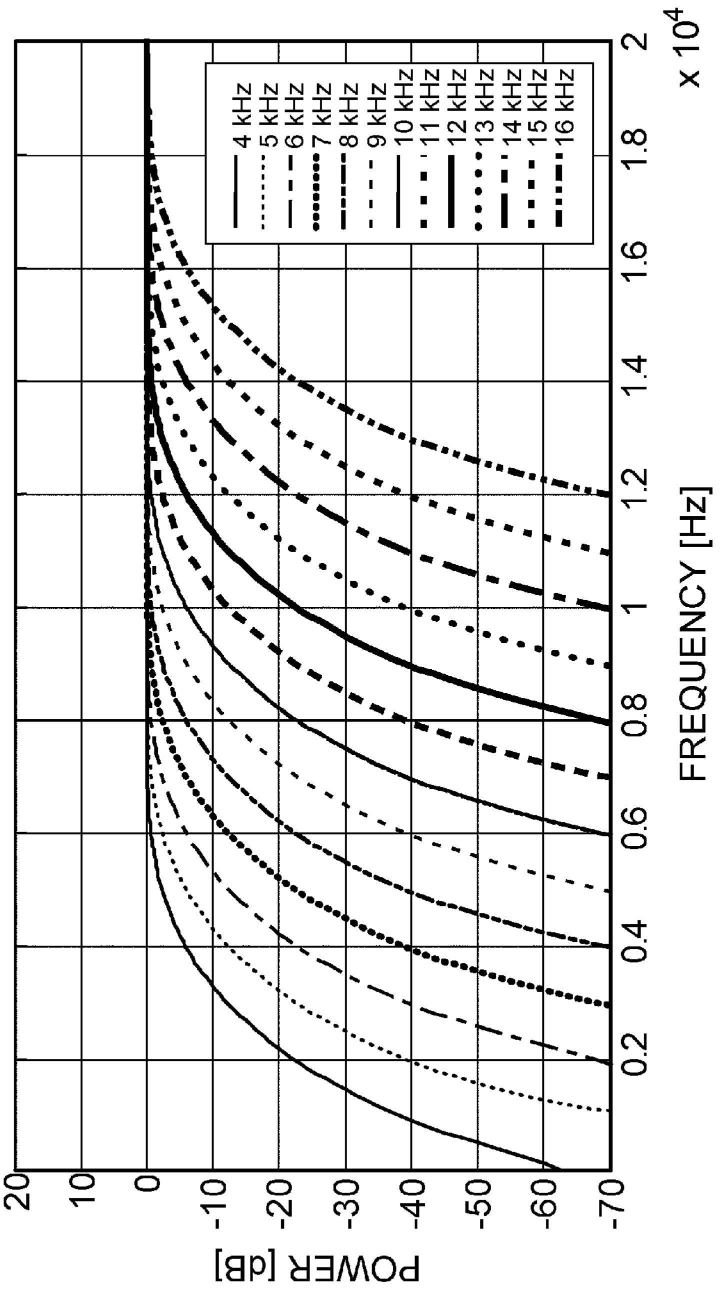
FIG. 9 is a graph showing filter characteristics of a high-pass filter (HPF) corresponding to the respective filter coefficient. The high-pass filter shown in FIG. 9 is a 32-tap FIR filter using Black-man window, in which cut-off frequencies from 4 kHz to 16 kHz are set with 1 kHz intervals.

FIG. 9 is a graph showing filter characteristics of a high-pass filter (HPF) corresponding to the respective filter coefficient. The high-pass filter shown in FIG. 7 is a 32-tap FIR filter using Black-man window, in which cut-off frequencies from 4 kHz to 16 kHz are set with 1 kHz intervals.

In Table 2 of FIGS. 8, 1st to 13th HPF frequency band determination values are shown. That is, the number of HPF frequency band determination values in Table 2 is larger than that shown in Table 1 of FIG. 4 in which 1st to 9th HPF frequency band determination values are shown. That is, as described above, the offset value is added to the frequency band determination value to thereby increase the number of HPF frequency bands to be determined.

For example, the frequency characteristics of the pink noise shown in FIG. 6(*a*) are comparatively flat, so that the offset amount is 0; on the other hand, the value of the high-frequency band component is lower than that of the low-frequency band component in the frequency characteristics of the music shown in FIG. 6(*b*), so that 1 is obtained as the offset amount in accordance with the inclination of FIG. 5. Therefore, in the case where the frequency band determination value of the frequency band determination section 11 is 7, the HPF frequency band determination value for the pink noise is 7, and HPF frequency band determination value for the music is 8 since the offset amount of 1 is added.

The HPF section 16 uses the high-pass filter (refer to FIG. 9) having a filter coefficient selected by the filter coefficient table section 15 to perform filtering for the audio signal. Through the filtering performed by the HPF section, the low-frequency signal component of the audio signal is limited.

Figure 10:
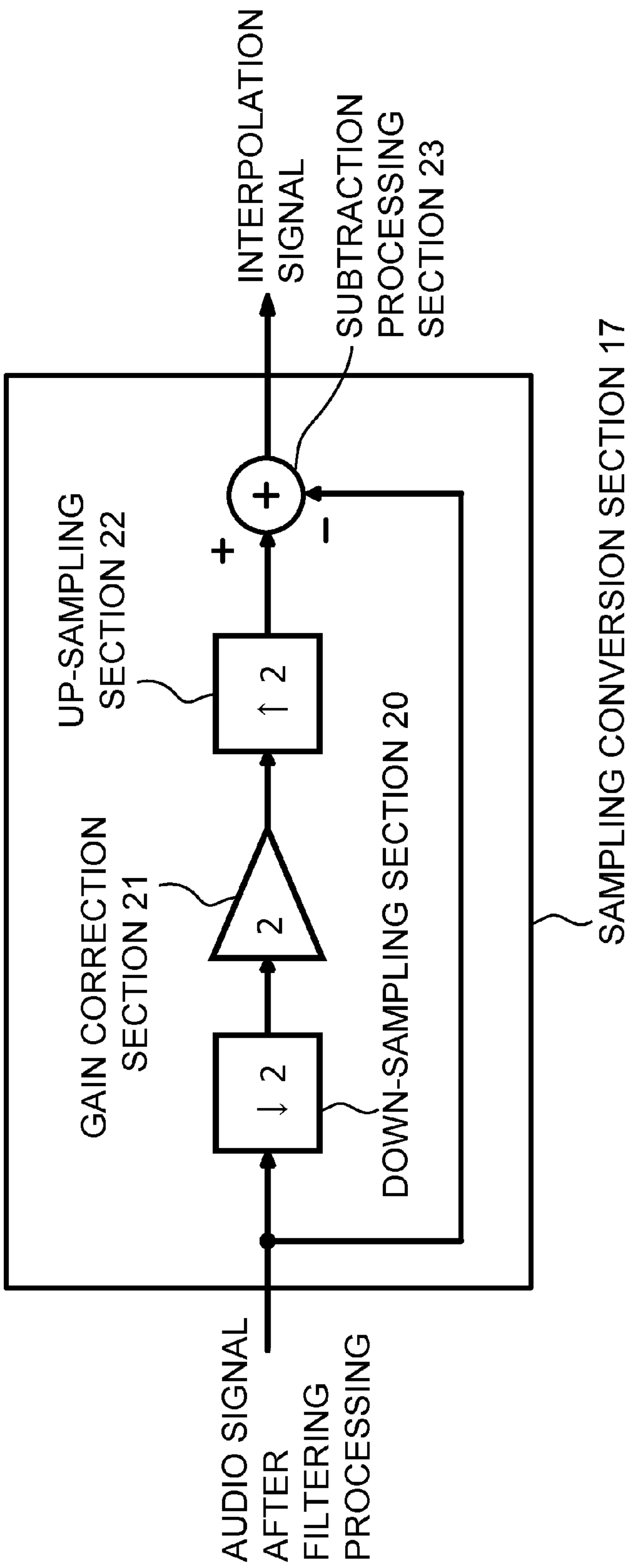
FIG. 10 is a block diagram showing a schematic configuration of a sampling conversion section according to the present embodiment.

The sampling conversion section 17 generates an interpolation signal based on the audio signal that has been subjected to the filtering by the HPF section 16. FIG. 10 is a block diagram showing a schematic configuration of the sampling conversion section 17. The sampling conversion section 17 includes a down-sampling section (down-sampling section) 20, a gain correction section 21, an up-sampling section (up-sampling section) 22, and a subtraction processing section (subtraction processing section) 23.

The audio signal that has been subjected to the filtering by the HPF section 16 is subjected to down-sampling processing by the down-sampling section 20, then subjected to gain correction by the gain correction section 21, and finally subjected to up-sampling processing by the up-sampling section 22. The audio signal subjected to the up-sampling processing is then subjected to subtraction processing with an audio signal that has not been subjected to the processing performed by the down-sampling section 20, gain correction section 21, and up-sampling section 22 by the subtraction processing section 23 to thereby generate an interpolation signal. The interpolation signal thus generated serves as a mirror signal of the input audio signal.

Figure 11B:
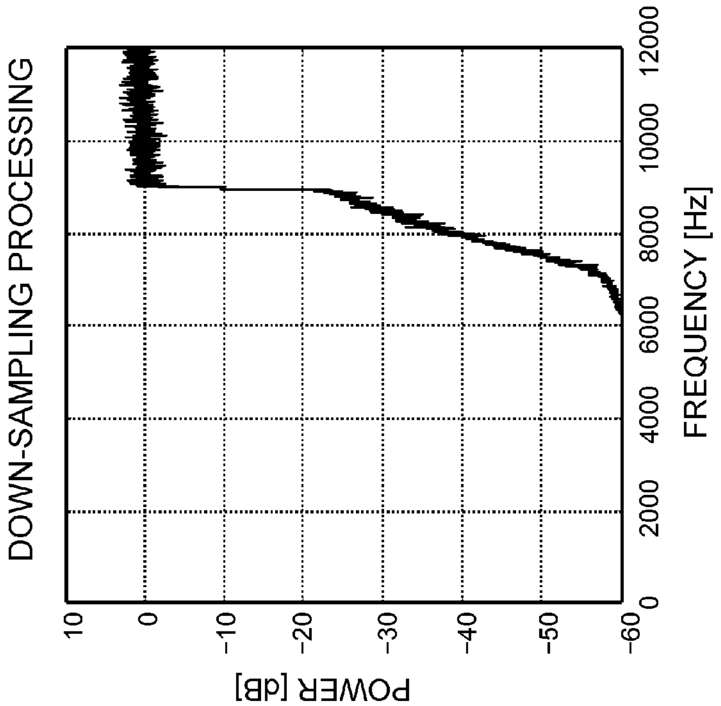
FIG. 11(*a*) shows the frequency characteristics of the audio signal that has been subjected to the filtering by the HPF section and FIG. 11(*b*) shows the frequency characteristics of a signal obtained through the down-sampling processing applied to the audio signal shown in FIG. 11(*a*).
Figure 11A:
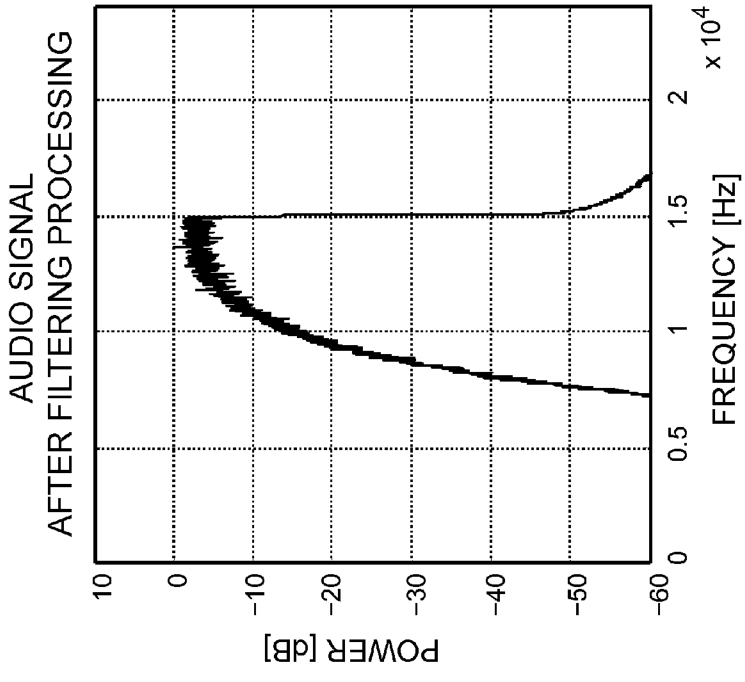

FIGS. 11(*a*), 11(*b*), 12(*a*), and 12(*b*) are graphs each showing a change in the frequency characteristics in the case where the white noise that has been subjected to the filtering (filtering using the high-pass filter) at a bandwidth of 15 kHz by the HPF section 16 is processed by the sampling conversion section 17.

Figure 12A:
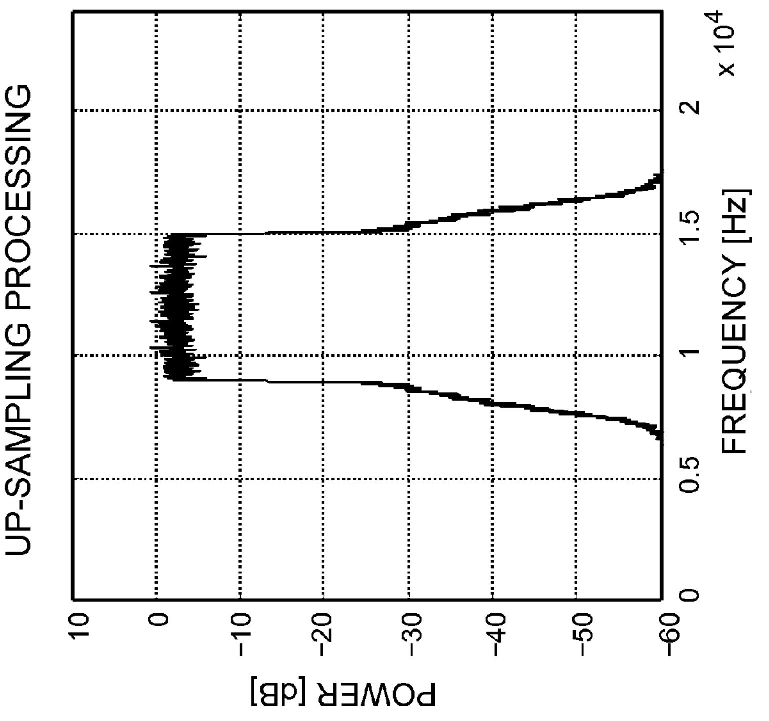
FIG. 12(*a*) shows the frequency characteristics of a signal obtained through the up-sampling processing applied to the signal resulting from the gain correction performed by the gain correction section and FIG. 12(*b*) shows the frequency characteristics of a signal obtained through the subtraction processing applied to the signal that has been subjected to the up-sampling processing.
Figure 12B:
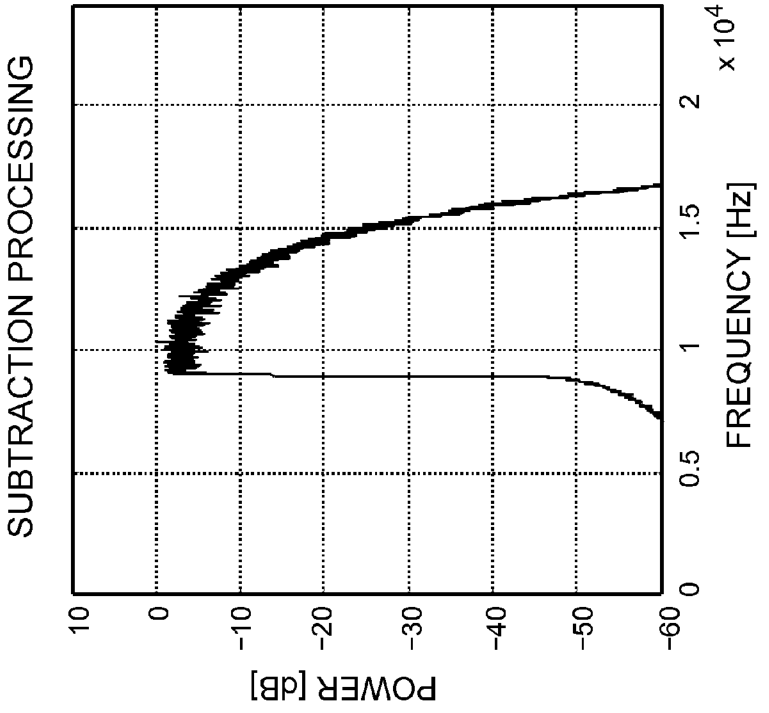

FIG. 11(*a*) shows the frequency characteristics of the audio signal that has been subjected to the filtering by the HPF section 16. FIG. 11(*b*) shows the frequency characteristics of a signal obtained through the down-sampling processing that the down-sampling section 20 has applied to the audio signal shown in FIG. 11(*a*). FIG. 12(*a*) shows the frequency characteristics of a signal obtained through the up-sampling processing that the up-sampling section 22 has applied to the signal resulting from the gain correction performed by the gain correction section 21. FIG. 12(*b*) shows the frequency characteristics of a signal obtained through the subtraction processing that the subtraction processing section 23 has applied between the audio signal (that has not been subject to any processing) and signal that has been subjected to the up-sampling processing.

As a result of the down-sampling processing and up-sampling processing performed by the sampling conversion section 17, aliasing is combined with the input audio signal. However, by applying the subtraction to the input audio signal, only the aliasing (mirror signal) eventually remains. The sampling conversion section 17 of the high-frequency interpolation device 1 of the present embodiment generates an interpolation signal without increasing the sampling rate (sampling frequency) of the audio signal, there by preventing an increase in a processing load which has been observed in a conventional high-frequency interpolation device.

Figure 13:
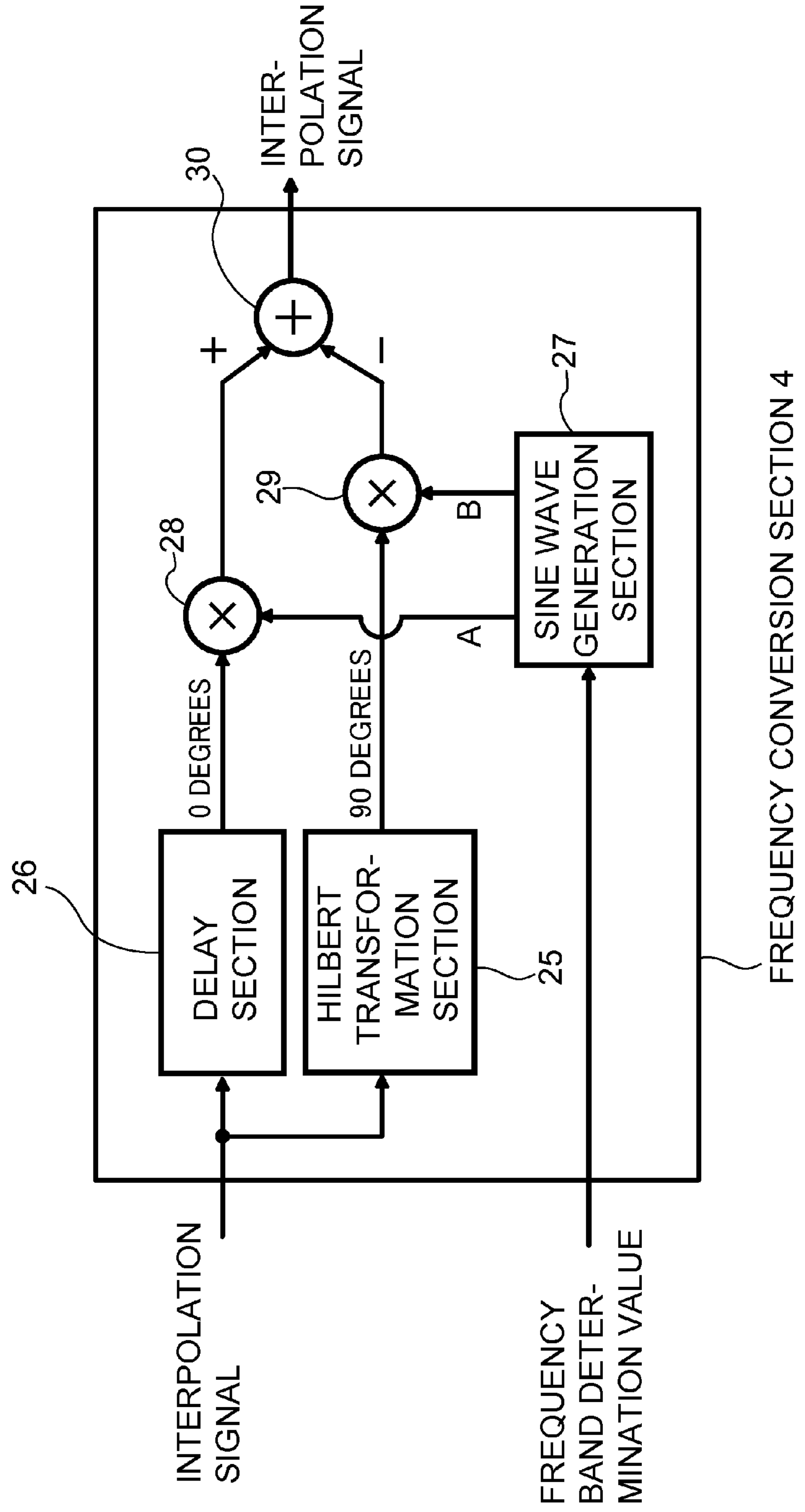
FIG. 13 is a block diagram showing a schematic configuration of a frequency conversion section according to the present embodiment.

Next, the frequency conversion section 4 will be described. The frequency conversion section 4 performs frequency adjustment (frequency conversion) for the interpolation signal generated by the interpolation signal generation section 3 in accordance with the audio signal. As shown in FIG. 13, the frequency conversion section 4 includes a Hilbert transformation section 25, a delay section 26, a sine wave generation section 27, multiplication processing sections 28 and 29, and a subtraction processing section 30.

The Hilbert transformation section 25 and delay section 26 generate interpolation signals having phases shifted by 0 degrees and 90 degrees relative to the interpolation signal generated by the sampling conversion section 17. For example, in the case where a 30-tap FIR (Finite Impulse Response) filter is used in the Hilbert transformation section 25, the delay section 26 sets a delay corresponding to 15 samples.

The sine wave generation section 27 generates sine waves having a phase of 0 degrees and 90 degrees in accordance with the frequency band determination value determined by the frequency band determination section 11 of the frequency band analysis section 2. Table 3 of FIG. 14 shows a relationship between the sine wave frequency corresponding to the frequency band determination value and its phase.

The sine wave frequency shown in Table 3 is divided with intervals of 2 kHz which is double the intervals set in the frequency band determination section 11. The sine wave frequency corresponds to the frequency conversion amount of the interpolation signal. In Table 3, in the case where one of 6th to 8th frequency bands is determined as the frequency band determination value, the sine wave generation section 27 performs frequency conversion of 2 kHz to 6 kHz to the high-frequency side. More specifically, the sine wave generation section 27 outputs (from A of the sine wave generation section 27 shown in FIG. 13) a sine wave having a 0 degrees phase for a 0 degrees phase interpolation signal output from the delay section 26 to make the multiplication processing section 28 perform integration processing. Further, the sine wave generation section 27 outputs (from B of the sine wave generation section 27 shown in FIG. 13) a sine wave having a 90 degrees phase for a 90 degrees phase interpolation signal output from the Hilbert transformation section 25 to make the multiplication processing section 29 perform integration processing.

In the case where one of 2nd to 4th frequency bands is determined as the frequency band determination value, the sine wave generation section 27 inverts the phases of the 6th to 8th frequency bands to perform frequency conversion of 2 kHz to 6 kHz to the negative, i.e., low-frequency side. More specifically, the sine wave generation section 27 outputs (from A of the sine wave generation section 27 shown in FIG. 13) a sine wave having a 90 degrees phase for a 0 degrees phase interpolation signal output from the delay section 26 to make the multiplication processing section 28 perform integration processing. Further, the sine wave generation section 27 outputs (from B of the sine wave generation section 27 shown in FIG. 13) a sine wave having a 0 degrees phase for a 90 degrees phase interpolation signal output from the Hilbert transformation section 25 to make the multiplication processing section 29 perform integration processing.

In the case where a 5th frequency band is determined as the frequency band determination value, the sine wave generation section 27 outputs (from A of the sine wave generation section 27 shown in FIG. 13) 1 for a 0 degrees phase interpolation signal output from the delay section 26 and outputs (from B of the sine wave generation section 27 shown in FIG. 13) 0 for a 90 degrees phase interpolation signal output from the Hilbert transformation section 25. In this case, the frequency conversion of the interpolation signal is not performed.

In the case where one of 1st and 9th frequency bands is determined as the frequency band determination value, the sine wave generation section 27 outputs 0 for a 0 degrees phase interpolation signal output from the delay section 26 and 90 degrees phase interpolation signal output from the Hilbert transformation section 25 and therefore does not perform the high-frequency interpolation using the interpolation signal. The case where one of 1st and 9th frequency bands is selected by the sine wave generation section 27 is a case where the frequency band of the audio signal does not exist within an assumed range, which corresponds to a case where the frequency band is lower than 9.5 kHz or higher than 16.5 kHz (refer to the frequency range shown in Table 1 of FIG. 4) in the present embodiment. Further, the case where the frequency band of the audio signal does not exist within an assumed range also corresponds to a case where the threshold detection section 9 cannot detect the bandwidth.

The interpolation signals thus calculated in the multiplication processing sections 28 and 29 are subjected to subtraction by the subtraction processing section 30 to be a high-frequency interpolation signal achieving frequency conversion and having no aliasing.

Then, as shown in FIG. 1, the high-frequency interpolation signal generated in the frequency conversion section 4 is combined with the original audio signal in the addition section 6, whereby an audio signal (original audio signal+high-frequency interpolation signal) in which a high-frequency band component is interpolated is generated. Note that delay processing is set for the original audio signal by the delay section 5. This corrects the delay accompanied by the high-frequency interpolation processing.

Figure 15B:
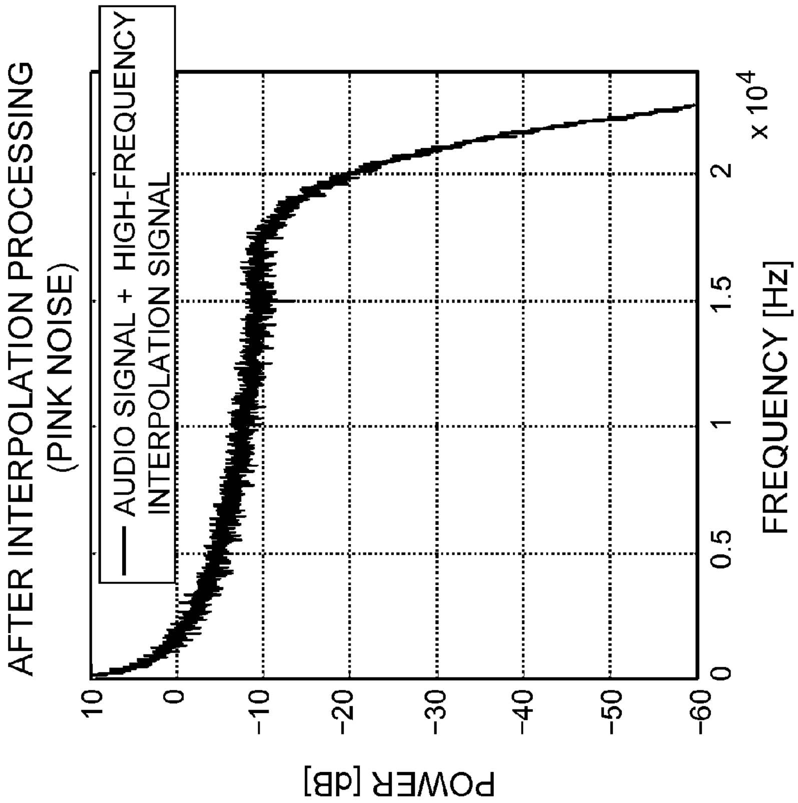
FIG. 15(*a*) shows frequency characteristics of an audio signal before the high-frequency interpolation device applies the interpolation processing to pink noise having a frequency band of 15 kHz and FIG. 15(*b*) shows frequency characteristics of an audio signal after the high-frequency interpolation device has applied the high-frequency interpolation processing.
Figure 15A:
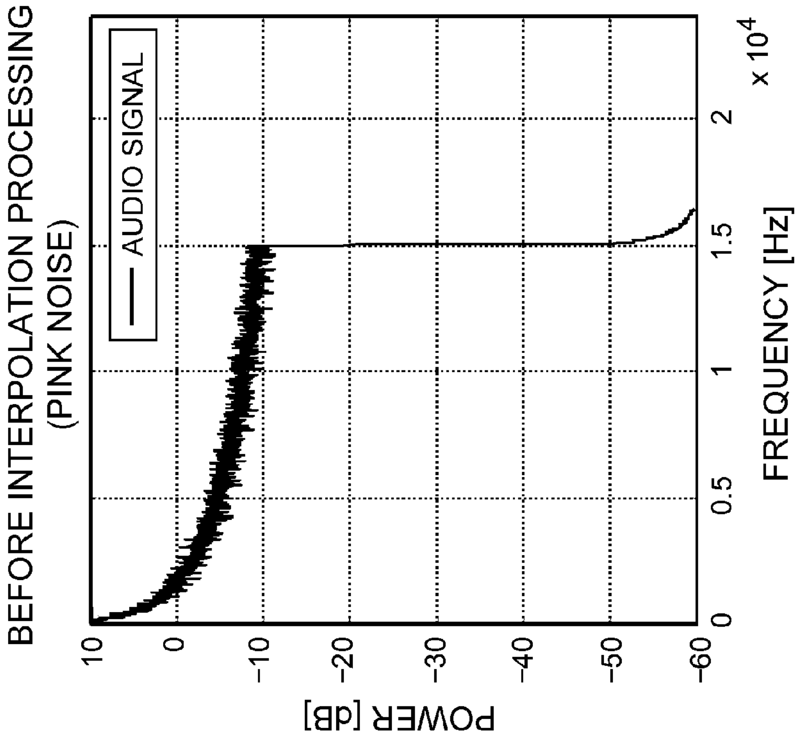
Figure 16B:
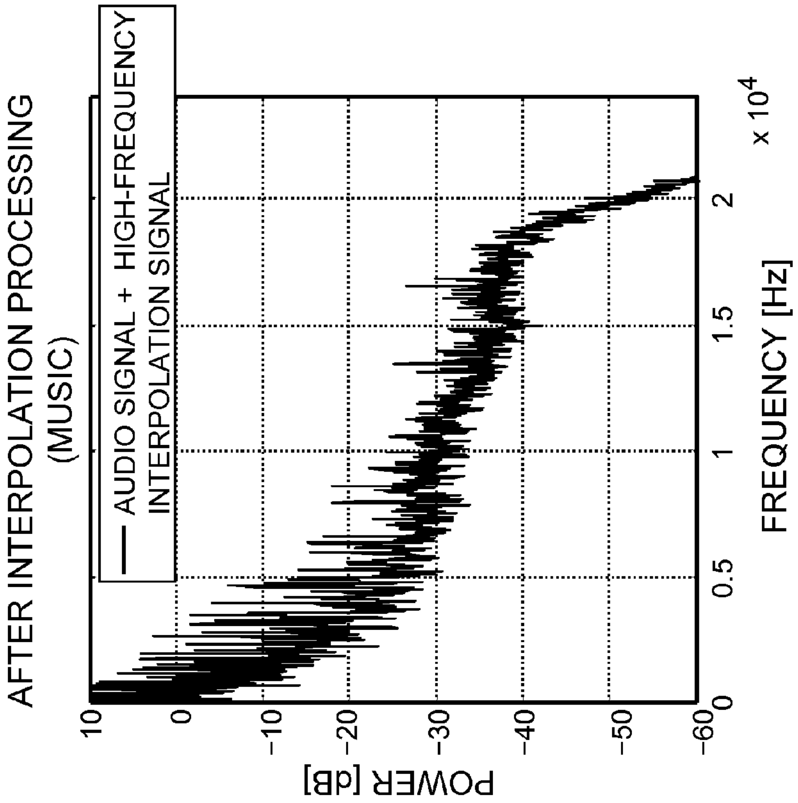
FIG. 16(*a*) shows frequency characteristics of an audio signal before the high-frequency interpolation device applies the interpolation processing to music having a frequency band of 15 kHz and FIG. 16(*b*) shows frequency characteristics of an audio signal after the high-frequency interpolation device has applied the high-frequency interpolation processing.
Figure 16A:
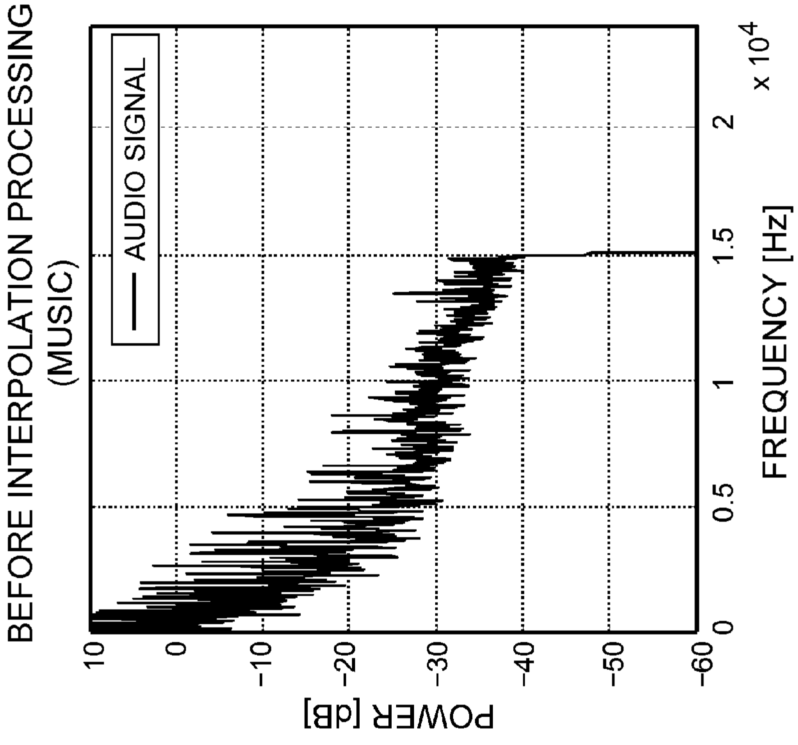
Figure 17B:
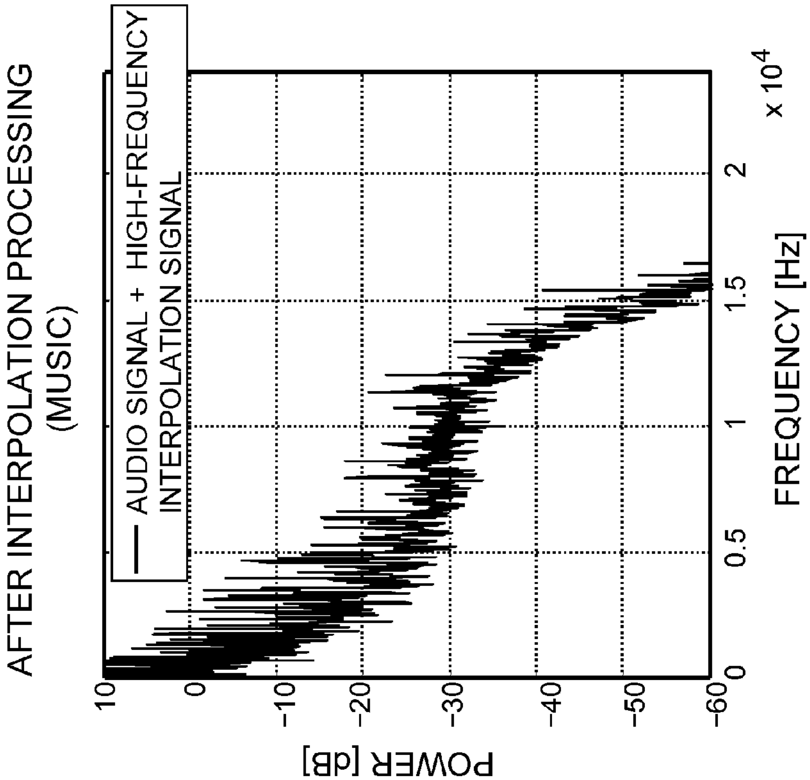
FIG. 17(*a*) shows frequency characteristics of an audio signal before the high-frequency interpolation device applies the interpolation processing to music having a frequency band of 10 kHz and FIG. 17(*b*) shows frequency characteristics of an audio signal after the high-frequency interpolation device has applied the high-frequency interpolation processing.
Figure 17A:
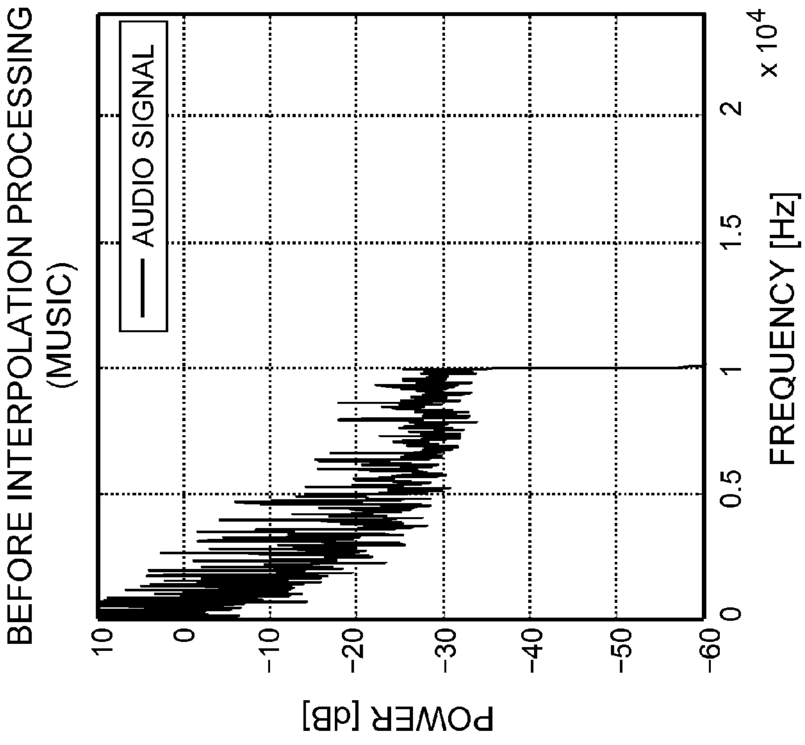

FIGS. 15 to 17 are graphs showing effect of the high-frequency interpolation achieved by the high-frequency interpolation device of the present embodiment. FIG. 15(*a*) shows frequency characteristics of an audio signal before the high-frequency interpolation device 1 applies the interpolation processing to pink noise having a frequency band of 15 kHz. FIG. 15(*b*) shows frequency characteristics of an audio signal after the high-frequency interpolation device 1 has applied the high-frequency interpolation processing. FIG. 16(*a*) shows frequency characteristics of an audio signal before the high-frequency interpolation device 1 applies the interpolation processing to music having a frequency band of 15 kHz. FIG. 16(*b*) shows frequency characteristics of an audio signal after the high-frequency interpolation device 1 has applied the high-frequency interpolation processing. FIG. 17(*a*) shows frequency characteristics of an audio signal before the high-frequency interpolation device 1 applies the interpolation processing to music having a frequency band of 10 kHz. FIG. 17(*b*) shows frequency characteristics of an audio signal after the high-frequency interpolation device 1 has applied the high-frequency interpolation processing.

As shown in FIGS. 15 to 17, by performing the high-frequency interpolation processing using the high-frequency interpolation device 1, it is possible to add (interpolate) an interpolation signal in which spectrum in frequency characteristics develops in a continuous manner to an original audio signal without depending on the bandwidth or frequency level of an audio source (audio signal) (or in an optimum state in accordance with the original audio signal). With the audio signal in which a high-frequency component is interpolated, it is possible to allow a listener to enjoy richness or punch of the music.

As described above, in the high-frequency interpolation device 1 of the present embodiment, the sampling conversion section 17 of the interpolation signal generation section performs the down-sampling processing, up-sampling processing, and subtraction processing in a combined manner to thereby generate an interpolation signal without increasing the sampling rate (sampling frequency) of the audio signal.

In particular, the determination of the frequency band is made based on the bandwidth of an audio signal in the frequency analysis section 2, and then the filtering is applied to the audio signal using a filter corresponding to the determined frequency band, followed by the processing of the sampling conversion section 17, whereby an interpolation signal whose frequency has been adjusted to an optimum value can be generated.

Further, the frequency conversion is performed in accordance with the determined frequency band in the frequency conversion section 4, which allows the interpolation signal to be adjusted in accordance with the frequency level. Thus, the generated interpolation signal can optimally be adjusted to the bandwidth/frequency level of the audio signal, allowing generation of an interpolation signal in which spectrum in frequency characteristics of the audio signal develops in a continuous manner.

Although the present invention has been shown and described with reference to the accompanying drawings, the high-frequency interpolation device of the present invention is not limited to the above embodiment. It will be apparent to those having ordinary skill in the art that a number of modifications or alternations to the invention as described herein may be made, none of which departs from the spirit of the present invention. All such modifications and alternations should therefore be seen as within the scope of the present invention.

The invention claimed is:

1. A high-frequency interpolation device comprising:

a frequency band determination section that determines a bandwidth type of an audio signal as a frequency band determination value preset for each bandwidth according to the frequency characteristics of the audio signal;

an interpolation signal generation section that selects a filter coefficient of a high-pass filter in accordance with the frequency band determination value, performs filtering for the audio signal by using the high-pass filter having the selected filter coefficient, and generates a high-frequency interpolation signal for the audio signal; and a frequency conversion section that performs frequency conversion of the interpolation signal generated by the interpolation signal generation section in accordance with the frequency band determination value determined by the frequency band determination section.

2. A high-frequency interpolation device comprising:

a frequency band determination section that determines a bandwidth type of an audio signal as a frequency band determination value preset for each bandwidth according to the frequency characteristics of the audio signal; and an interpolation signal generation section that selects a filter coefficient of a high-pass filter in accordance with the frequency band determination value, performs filtering for the audio signal by using the high-pass filter having the selected filter coefficient, and generates a high-frequency interpolation signal for the audio signal, the interpolation signal generation section comprising:

a down-sampling section that performs down-sampling processing for the signal that has been subjected to the filtering of the audio signal by the high-pass filter;

an up-sampling section that performs up-sampling processing for the signal that has been subjected to the down-sampling processing; and a subtraction processing section that subtracts the signal that has been subjected to the filtering of the audio signal by the high-pass filter from the signal that has been subjected to the up-sampling processing.

3. A high-frequency interpolation method comprising;

a frequency band determination step in which a frequency band determination section determines a bandwidth type of an audio signal as a frequency band determination value preset for each bandwidth according to the frequency characteristics of the audio signal;

an interpolation signal generation step in which an interpolation signal generation section selects a filter coefficient of a high-pass filter in accordance with the frequency band determination value, performs filtering for the audio signal by using the high-pass filter having the selected filter coefficient, and generates a high-frequency interpolation signal for the audio signal; and a frequency conversion step in which a frequency conversion section performs frequency conversion of the interpolation signal generated in the interpolation signal generation step in accordance with the frequency band determination value determined in the frequency band determination step.

4. A high-frequency interpolation method comprising:

a frequency band determination step in which a frequency band determination section determines a bandwidth type of an audio signal as a frequency band determination value preset for each bandwidth according to the frequency characteristics of the audio signal; and an interpolation signal generation step in which an interpolation signal generation section selects a filter coefficient of a high-pass filter in accordance with the frequency band determination value, performs filtering for the audio signal by using the high-pass filter having the selected filter coefficient, and generates a high-frequency interpolation signal for the audio signal, the interpolation signal generation step comprising:

a down-sampling step in which a down-sampling section performs down-sampling processing for the signal that has been subjected to the filtering of the audio signal by the high-pass filter;

an up-sampling step in which an up-sampling section performs up-sampling processing for the signal that has been subjected to the down-sampling processing; and a subtraction processing step in which a subtraction processing section subtracts the signal that has been subjected to the filtering of the audio signal by the high-pass filter from the signal that has been subjected to the up-sampling processing.

* * * * *